United States Patent [19]
Baxter

[11] Patent Number: 5,627,378
[45] Date of Patent: May 6, 1997

[54] DIE SET FOR AUTOMATIC UV EXPOSURE SYSTEM

[75] Inventor: Greg Baxter, Orange, Calif.

[73] Assignee: ORC Electronic Products, A Divison of Benson Eyecare Corporation, Azusa, Calif.

[21] Appl. No.: 608,168

[22] Filed: Feb. 28, 1996

[51] Int. Cl.$^6$ .................................................. G03B 27/04
[52] U.S. Cl. ........................ 250/455.11; 250/454.11; 250/504 R; 355/53; 356/401
[58] Field of Search .................. 250/455.11, 453.11, 250/454.11, 493.1, 494.1, 503.1, 504 R, 548; 356/399, 400, 401; 355/53

[56] References Cited

U.S. PATENT DOCUMENTS

| | | | |
|---|---|---|---|
| 3,192,844 | 7/1965 | Szasz et al. | 95/73 |
| 3,937,579 | 2/1976 | Schmidt | 356/144 |
| 3,963,489 | 6/1976 | Cho | 96/27 R |
| 4,414,749 | 11/1983 | Johannsmeier | 33/180 R |
| 4,525,061 | 6/1985 | Oki | 355/72 |
| 4,547,066 | 10/1985 | Murai | 355/97 |
| 4,721,980 | 1/1988 | Yazaki | 355/26 |
| 4,741,458 | 5/1988 | de Masi | 355/53 |
| 4,764,791 | 8/1988 | Omata et al. | 355/26 |
| 4,835,078 | 5/1989 | Harvey et al. | 430/22 |
| 4,842,412 | 6/1989 | Miyake | 356/401 |
| 4,926,489 | 5/1990 | Danielson et al. | 382/8 |
| 4,937,162 | 6/1990 | Goirand et al. | 430/22 |
| 4,952,060 | 8/1990 | Ina et al. | 356/407 |
| 4,970,587 | 11/1990 | Abe | 358/93 |
| 5,042,709 | 8/1991 | Cina et al. | 228/105 |
| 5,050,111 | 9/1991 | Ayata et al. | 364/559 |
| 5,182,615 | 1/1993 | Kurosawa et al. | 356/400 |
| 5,337,151 | 8/1994 | Baxter et al. | 356/401 |

FOREIGN PATENT DOCUMENTS

0618505A1  5/1994  European Pat. Off. .

Primary Examiner—Jack I. Berman
Assistant Examiner—Kiet T. Nguyen
Attorney, Agent, or Firm—Christie, Parker & Hale, LLP

[57] ABSTRACT

A double-sided exposure apparatus is disclosed. The apparatus incorporates a phototool die set that provides high accuracy, speed and smooth operation with minimal particulate contamination of the exposure zone while allowing conventional work piece transport and handling. Upper and lower die halves are supported by four corner posts, guided by precision preloaded bearings to obtain high accuracy in front to back registration of art works maintained in the upper and lower die halves. The die halves are reversibly separated by upward motion actuated by a closed loop servo motor and lead screw system simultaneously elevating the four corner posts to which the upper die half is rigidly attached.

14 Claims, 13 Drawing Sheets

DIE SET FOR AUTOMATIC UV EXPOSURE SYSTEM

BACKGROUND OF THE INVENTION

1. Field of the Invention

The present invention generally relates to double-sided UV exposure systems for printed circuit board manufacturing and more particularly to a four post phototool die set incorporating all actuation elements below the exposure plane to avoid particulate contamination of art work or work pieces within the exposure chamber.

2. Description of the Prior Art

Double-sided exposure systems for printed circuit boards have been developed employing motorized systems for photo tool die set operation, art work alignment and die alignment. U.S. Pat. No. 5,337,151 entitled Double-sided CIRCUIT BOARD EXPOSURE MACHINE AND METHOD WITH OPTICAL REGISTRATION AND MATERIAL VARIATION COMPENSATION assigned to Optical Radiation Corporation, the assignee of the present application, discloses an integrated system for double-sided circuit board exposure.

The requirements for increasing precision in the processing of printed circuit boards for alignment of art works and work pieces as well as maintaining cleanliness of the photo exposure environment continue to increase as additional reduction in lead pitch and density for PCB applications occurs. A need therefore exists for double-sided exposure systems maintaining high accuracy, speed and smooth operation while conforming to clean room design principles. Such systems however, must preferably accommodate automated work piece transport and handling systems available on current exposure devices.

SUMMARY OF THE INVENTION

The double-sided exposure apparatus of the present invention incorporates a phototool die set that provides high accuracy, speed and smooth operation with minimal particulate contamination of the exposure zone while allowing conventional work piece transport and handling. The upper and lower die halves are supported by four corner posts, guided by precision pre-loaded bearings to obtain high accuracy in front to back registration of the art works maintained in the upper and lower die.

The upper die is separated from the lower die by upward motion actuated by a closed loop servo motor and lead screw system simultaneously elevating the four corner posts to which the upper die is rigidly attached. The motor and lead screw mechanisms are positioned at the bottom of the exposure compartment beneath the lower collimating mirror. Any particle generation from the movement of the die set occurs below the art works and work piece being exposed, thereby precluding contamination of the exposure area.

An elevation structure receiving the lower extremities of the four post support in linear bearings with adjustable end contacts for the posts, maintains high parallelism between the dies and further provides automatic relief on the registration system by avoiding rigid connection of the posts, thereby accommodating tolerance accumulation in differing thickness work pieces. This feature further provides a safety feature avoiding potential crushing injury for system operators or catastrophic damage to the photo tool die set through work piece misalignment or presence of extraneous materials in the exposure compartment.

The use of a true four post elevation system in the present invention allows conventional material transport arms to be straddled by the die set actuation system and allows free work area for the use of motorized alignment systems for art work and die alignment, while not obstructing the light path for collimated light in double sided exposure of work pieces.

DETAILED DESCRIPTION

A. Overview

Figure 1:
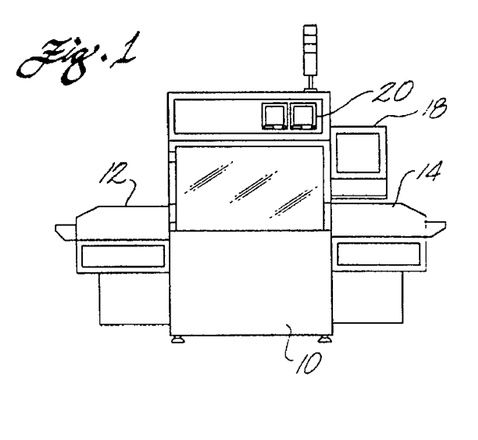
FIG. 1 is a front elevation view of a double-sided exposure system incorporating the present invention.
Figure 2:
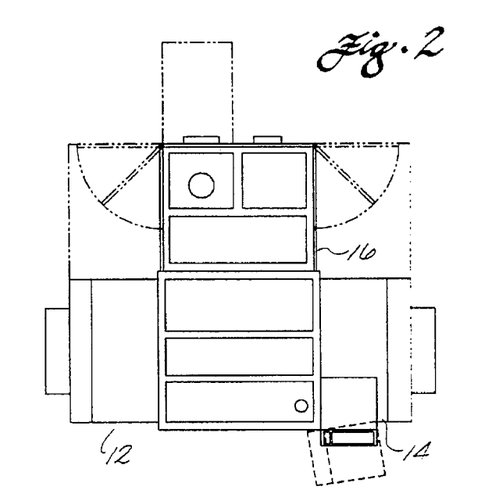
FIG. 2 is a top view of the exposure system shown in FIG. 1.
Figure 3:
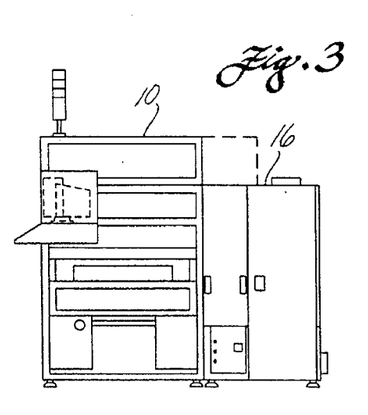
FIG. 3 is a right side elevation view of the exposure system of FIG. 1.

An exemplary double-sided UV exposure system incorporating the present invention is shown in FIGS. 1–3. The system incorporates an exposure cabinet 10, an infeed section 12, and an outfeed section 14. A lamphouse 16 is situated behind the exposure chamber as best seen in FIGS. 2 and 3. Conventional infeed and outfeed rollers and material transport arms are employed in the infeed and outfeed system as will be described in greater detail subsequently.

Control of the system is accomplished through a personal computer or other controller 18 mounted directly to the exposure cabinet for ease of access during operation. Video monitors 20 mounted in the top portion of the exposure cabinet are employed in combination with the motorized art work alignment system which will be described in greater detail subsequently.

Figure 4:
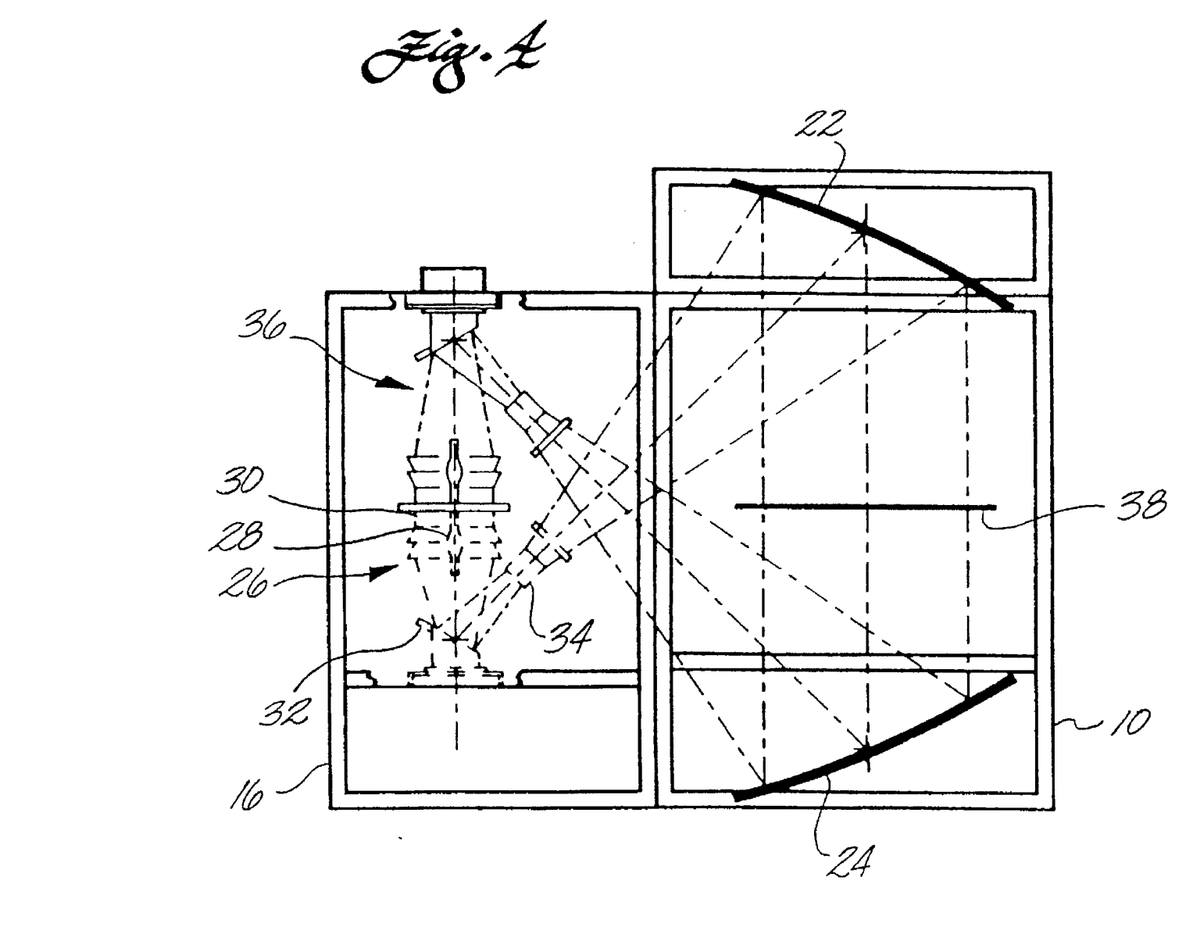
FIG. 4 is a schematic sectional view of the exposure cabinet and lamp house for an exposure system incorporating the present invention.

As shown schematically in FIG. 4 the exposure cabinet incorporates an upper collimating mirror 22 and a lower collimating mirror 24 which receive UV light for exposure of the work piece from optics in the lamphouse. The lamphouse incorporates an upper lamp module 26 which includes a UV lamp 28 and collector 30 reflecting light to a dichroic mirror 32 which reflects the light through an optical integrator and shutter system 34 to the upper collimating mirror. A lower lamp module 36 identical in configuration to the upper lamp module provides light to the lower collimating mirror. The collimating mirrors provide collimated light to the phototool work piece location 38 for exposure of the work piece. A detailed description of the exposure process and optics is provided in U.S. Pat. No. 5,337,151 which is incorporated herein by reference.

B. Phototool Die Set Structure

Figure 5:
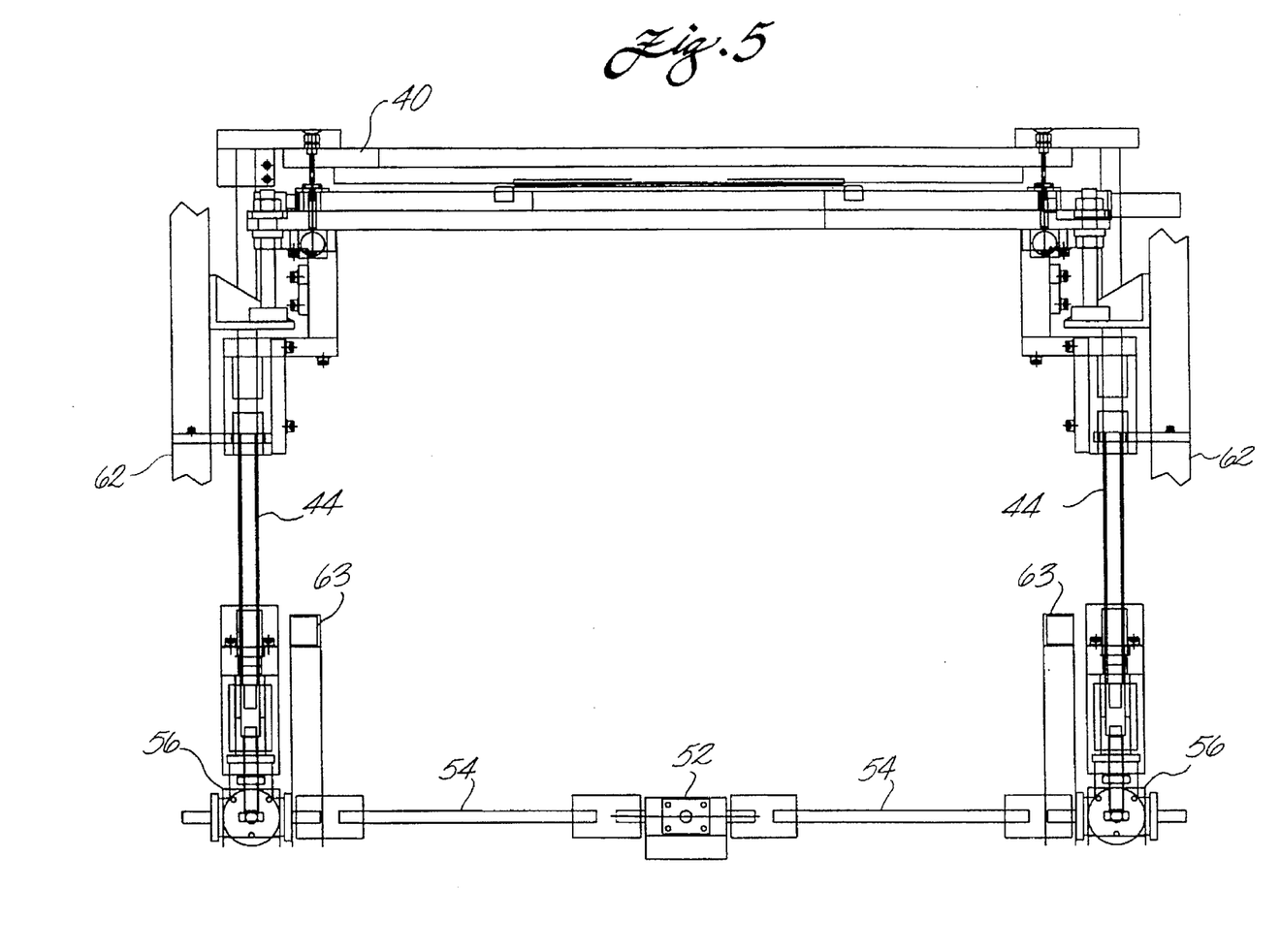
FIG. 5 is a front elevation view of the photo tool die set and servo actuation system.
Figure 6:
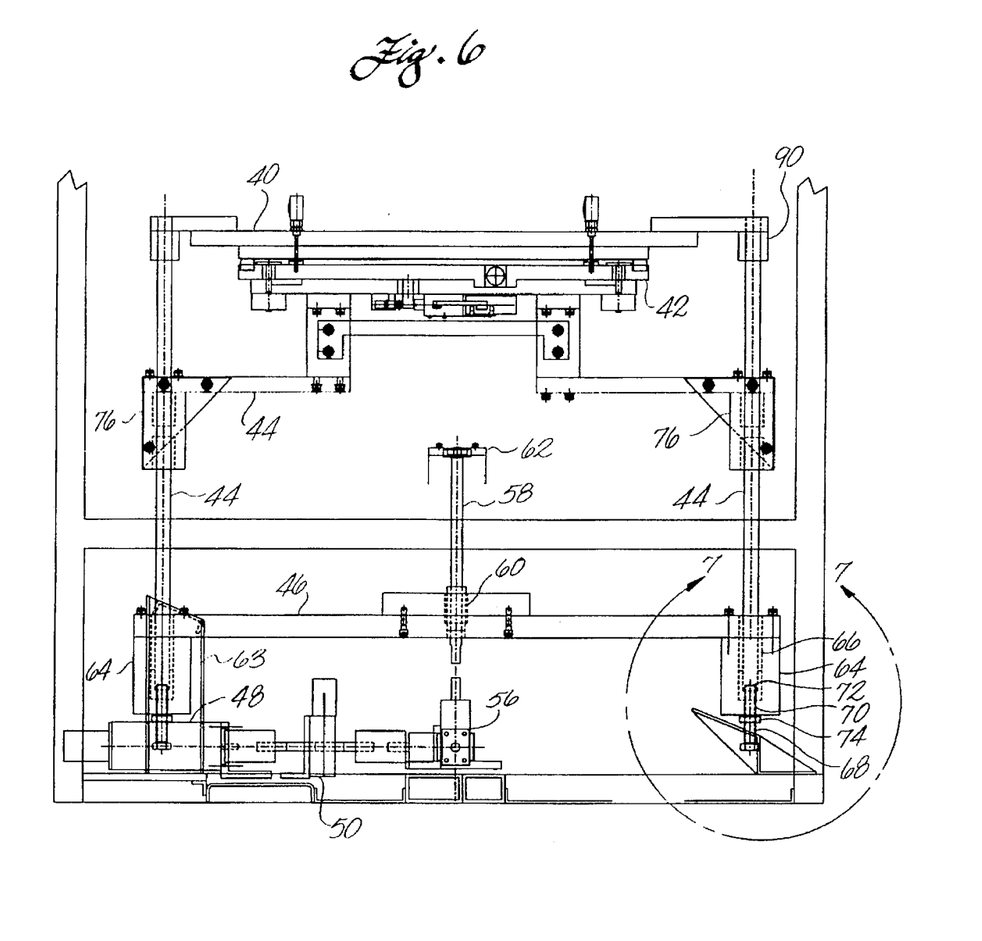
FIG. 6 is a side elevation view of the photo tool die set and servo actuation system.

The phototool die set structure of FIG. 5 is mounted to the base and support frame of the exposure cabinet. The die set comprises the upper die structure 40 and the lower die structure 42 which are maintained in registration by rods 44. The elevation structure, consisting in the embodiment shown in the drawings of two horizontal supports 46 for the four post system created by the rods, is best seen in FIG. 6.

Figure 14:
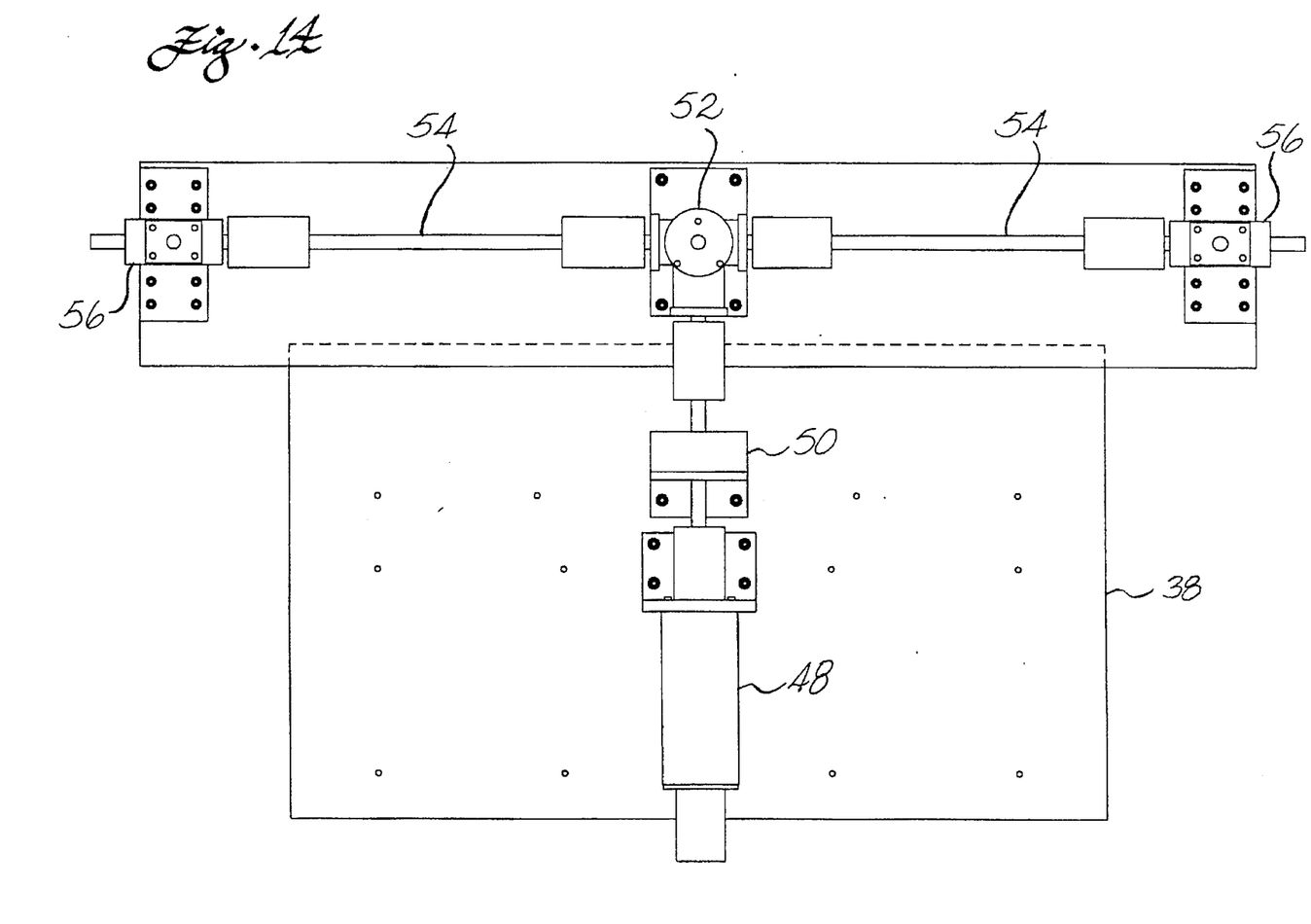
FIG. 14 is a top view of the servo actuation system including servo motor and transmission elements.

The servo motor and drive train for actuating the elevation structure includes a motor 48 which in the embodiment shown in the drawings is connection through reduction gearing 50 to the transmission 52, best seen in the top view provided by FIG. 14. The transmission drives axles 54 which in turn drive right angle gear boxes 56 which are in turn connected to ball screws 58. Ball nuts 60 mounted to the elevation structure horizontal supports 46 provide vertical translation of the elevation structure upon rotation of the ball screws. An upper mounting bearing 62 for the ball screws is attached to the exposure cabinet support frame. The servo drive system is mounted below the lower collimating mirror which is received on stand off brackets 63. In place on its mounts, the collimating mirror is straddled by the four post die set system. Particulate contamination of the lower collimating mirror by operation of the servo motor, drive train and elevation structure is minimized by this configuration. Further, the entire elevation structure and associated motor, transmission and operating elements is located below the exposure area of the phototool between the upper and lower dies. Consequently, particulate contamination of the exposure area through opening and closing of the die set to accept work pieces is substantially eliminated providing significant operating efficiency over prior art systems.

Figure 7:
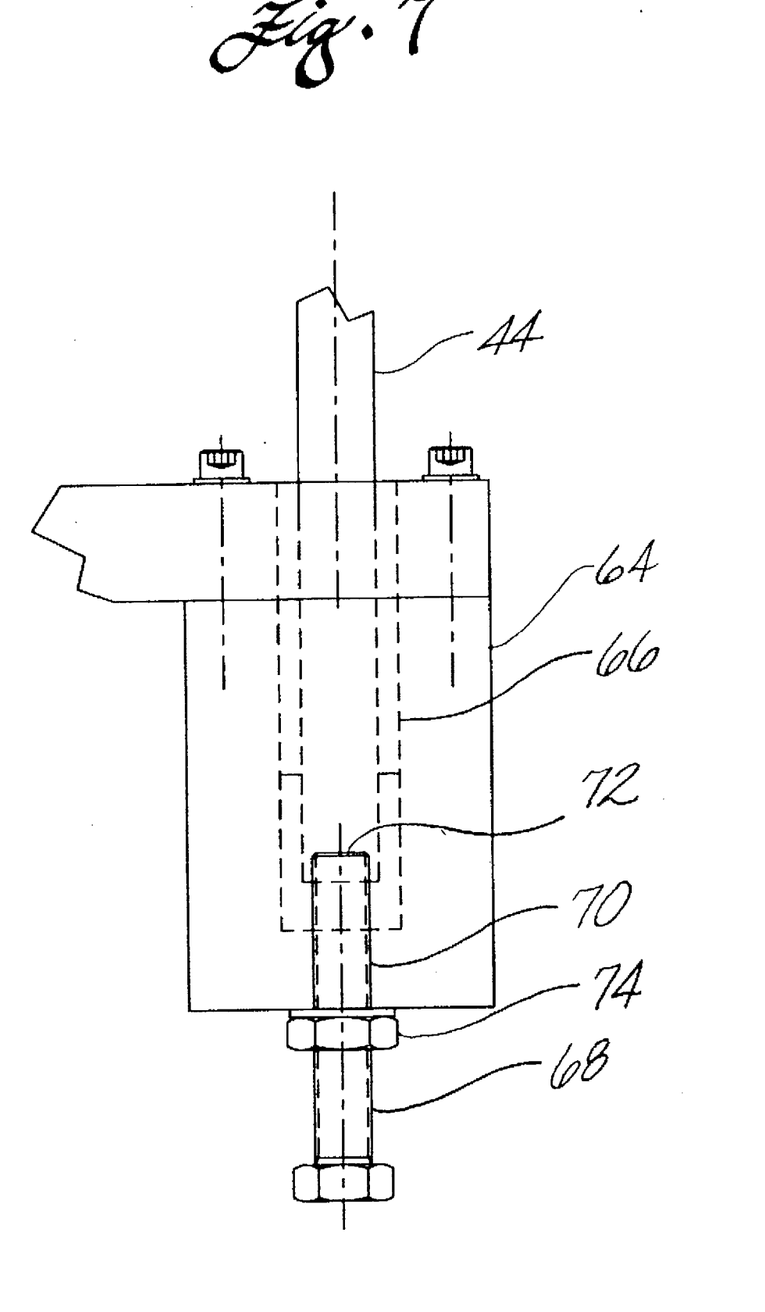
FIG. 7 is a detailed sectional view of the bearing block and adjustable end contact in the elevation structure for one of the four posts as designated 7—7 on FIG. 6.

Details of the bearing and end contact arrangement receiving the rods in the elevation structure is shown in FIG. 7. The rods are supported within a closed end bearing block 64 which receives the rod in a linear bearing 66. Contact with the rod is provided through a machine screw 68 inserted through a tapped hole 70 in the closed end. A carbide tip or insert 72 on the machine screw provides a hard contact surface to directly bear the rod end, without wear due to repeated contact. A locking nut 74 is provided on the machine screw. Vertical adjustment for precise alignment of the rods comprising the four post structure of the die set is accomplished by adjusting the machine screws in the end support.

Figure 8:
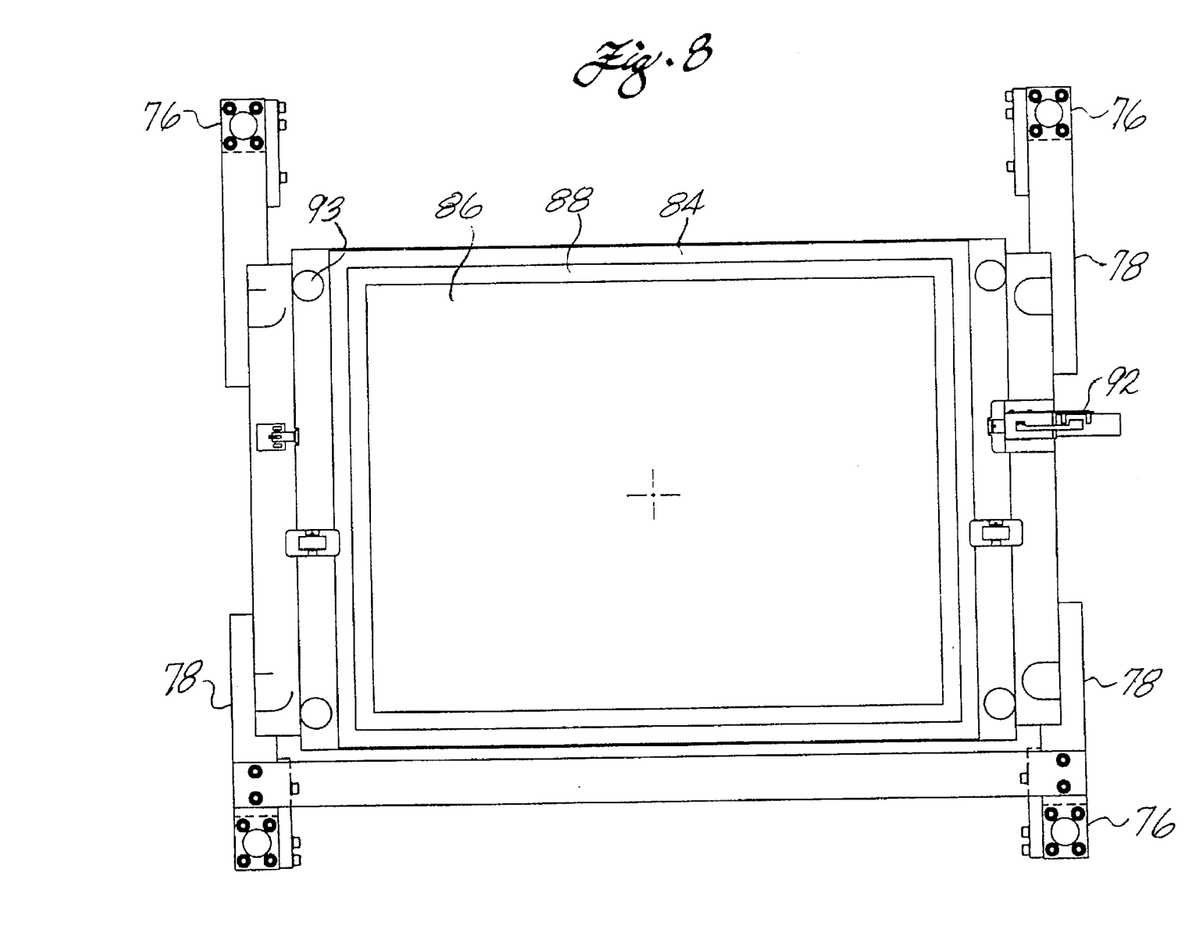
FIG. 8 is a top view of the lower die set structure.
Figure 9:
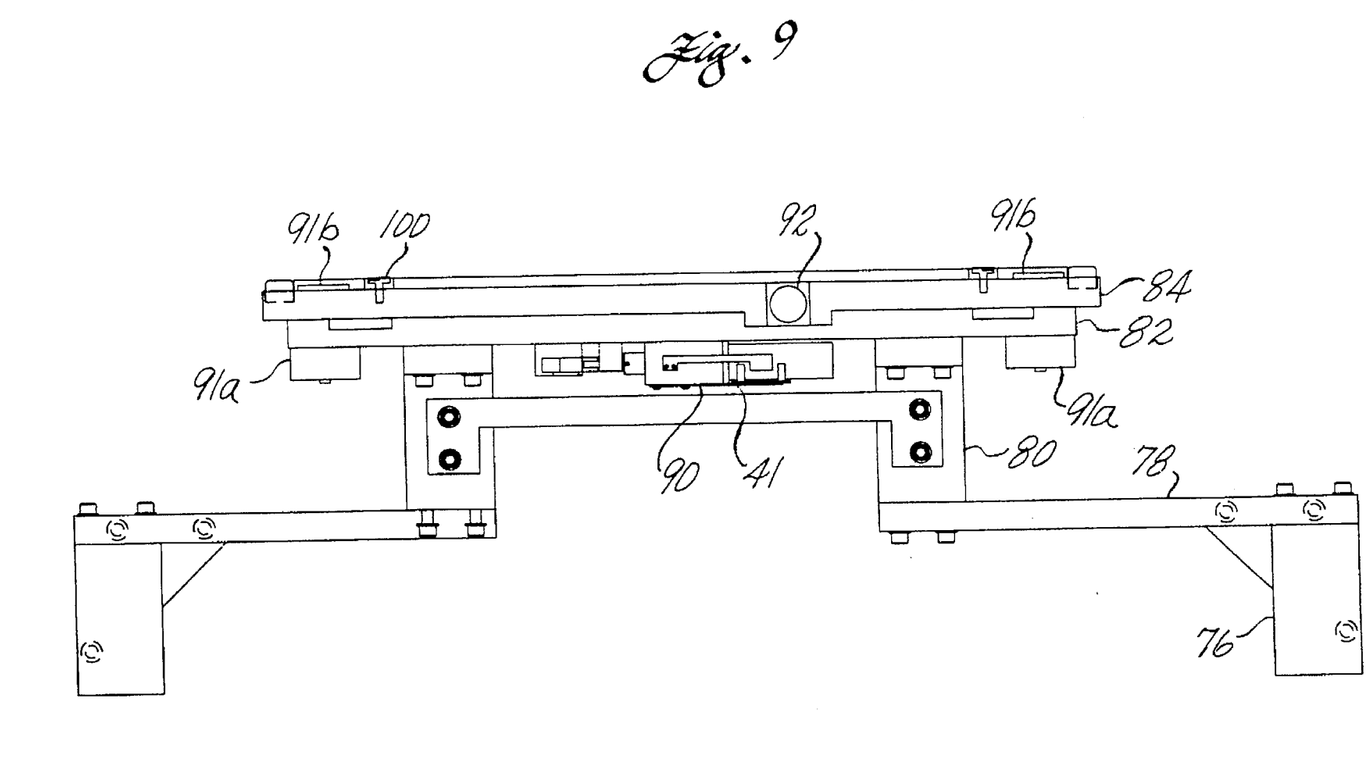
FIG. 9 is a front elevation view of the lower die set structure.
Figure 10:
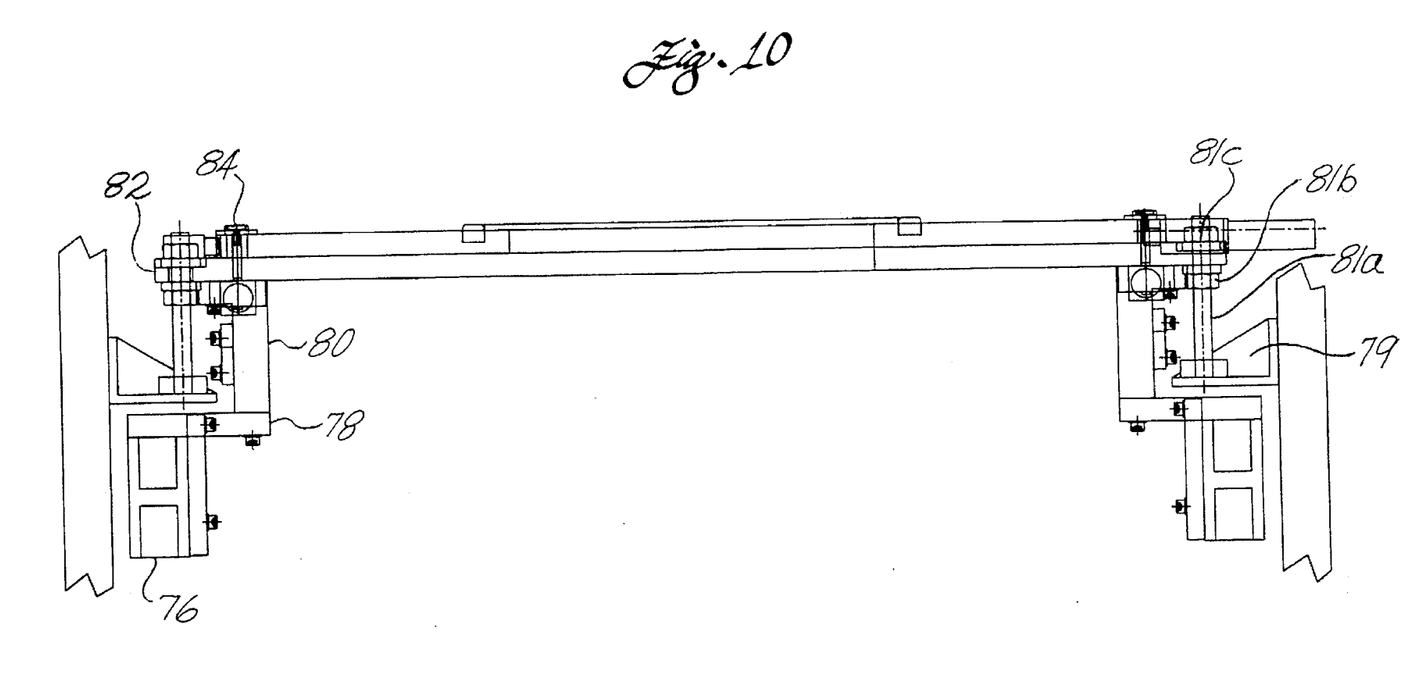
FIG. 10 is a side elevation view of the lower die structure.

The rods extend through bearing blocks 76 mounted to the lower die structure which is shown in detail in FIGS. 8, 9 and 10. The lower die bearing blocks are supported on arms 78 which extend from the lower die base structure 80. The lower die is rigidly attached to the frame of the exposure cabinet by brackets 79 with support machine bolts 81a extending through the body of the support base and secured by nuts 81b and c. Adjustment of the lower die to obtain true horizontal planarity is accomplished by adjusting the four support nuts 81b until the lower die is level, then securing the upper nuts 81c.

The lower die comprises two frames for relative motion in positioning art works; a lower frame 82 and an upper frame 84. Lower frame 82 is mounted to the base structure of the lower die. Upper frame 84 is supported by lower frame 82 and is translatable in two horizontal axes with rotation capability (x, y1, and y2).

Upper frame 84 houses support glass 86 for the lower art work of the phototool. The support glass incorporates vacuum grooves (not shown) to secure the art work film to the plate as is conventionally known in the art and an inflatable seal 88 for vacuum contact exposure of the work piece after insertion into the die set.

In the embodiments shown in the drawings, the translation of the upper frame is controlled by a pair of motor and limit switch units 90 located on opposing sides of the lower frame for "y1" and "y2" translation, best seen in FIG. 9, and a motor and limit switch unit 92 for "x" translation, best seen in FIG. 8. Differential operation of the "y1" and "y2" motors provides rotation of the frame. Pneumatic clamps 91a, placed at four locations proximate the corners of the upper and lower frame, extend through low tolerance holes in both frames and terminate in top plates 91b. Actuation of the clamps firmly engages the top plates with the top surface of the upper frame and places the upper frame in firm contact with the lower frame to preclude relative movement. Release of the clamps allows translation of the frames by use of motors 90 and 92.

Figure 11:
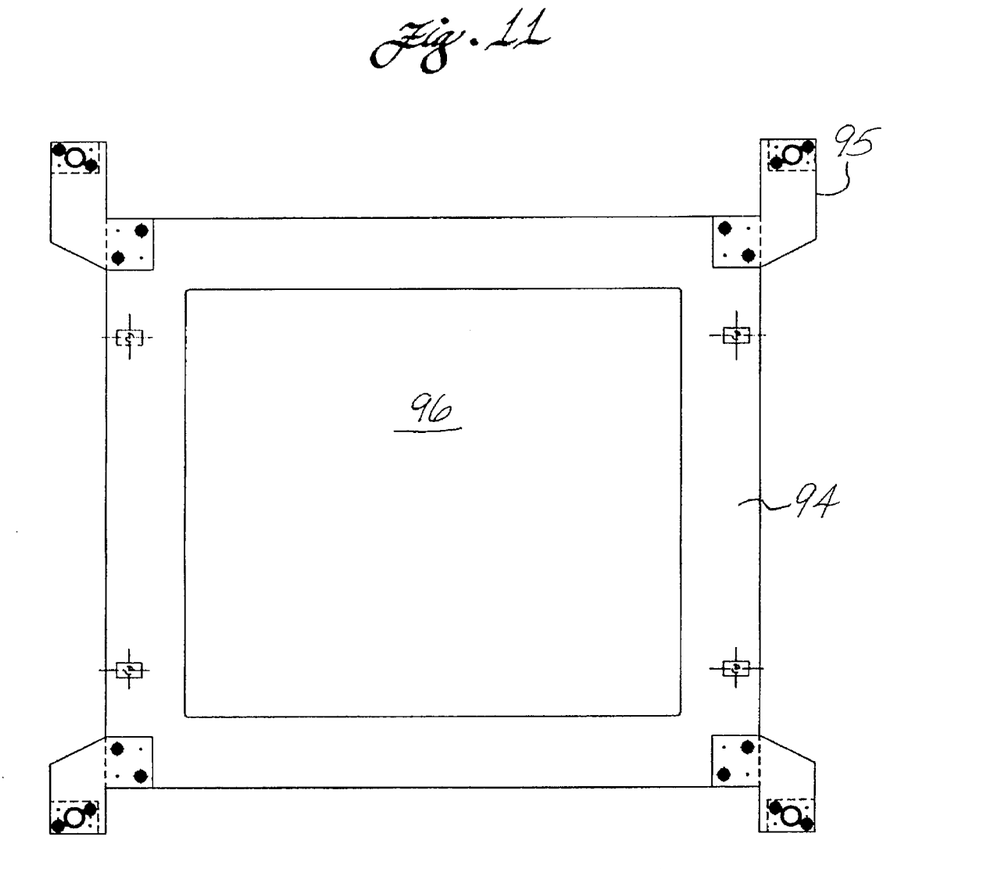
FIG. 11 is a top view of the upper die structure.
Figure 12:
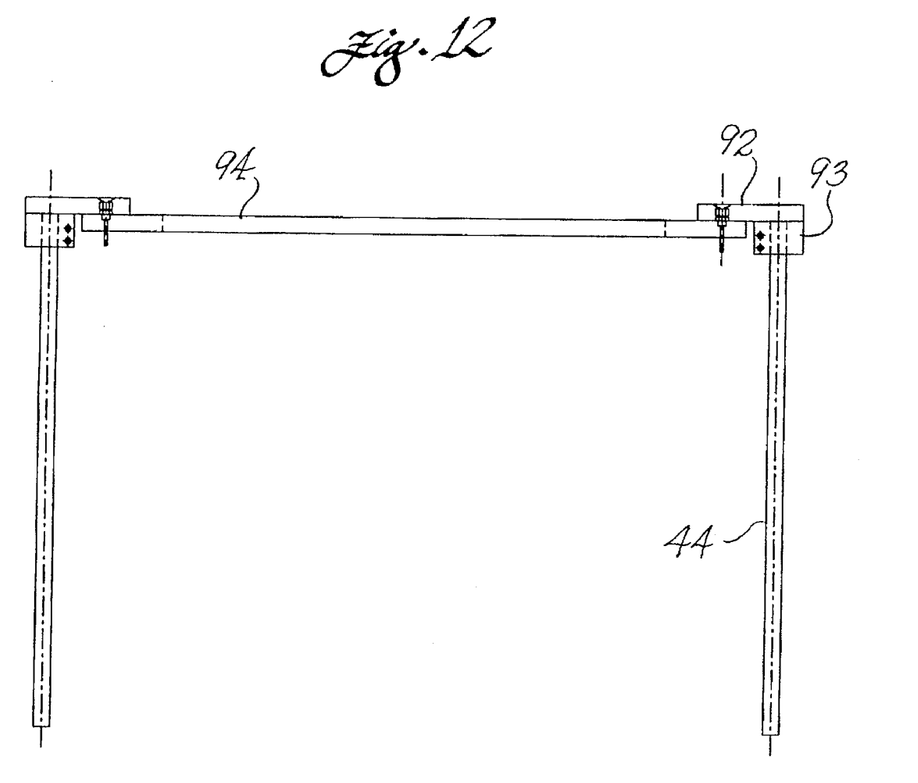
FIG. 12 is a front elevation view of the upper die structure and support posts.
Figure 13:
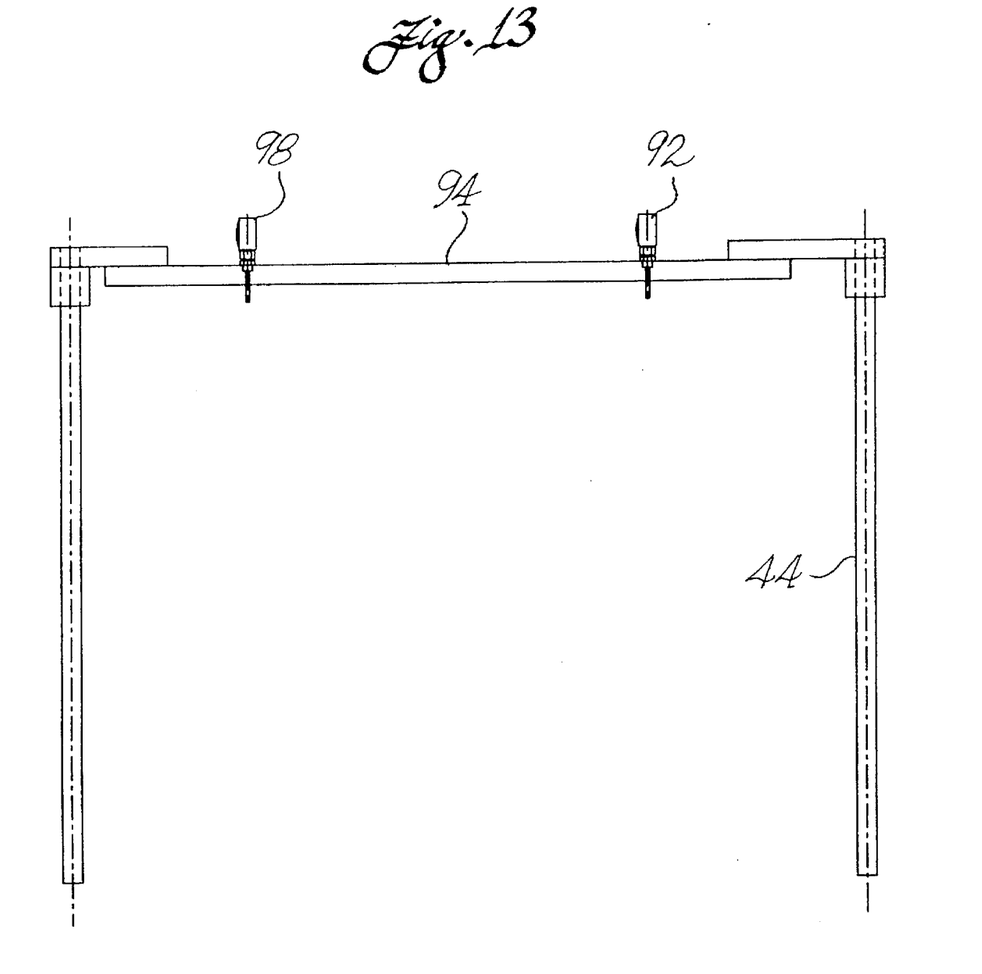
FIG. 13 is a side elevation view of the upper die structure and support posts.

Details of the upper die structure are shown in FIGS. 11–13. The upper rod ends are received in cylindrical caps 93 which are in turn supported by flanges 95 attached to the frame 94 of the upper die. The frame houses support glass 96 for mounting of the upper art work which is secured to the glass using vacuum grooves (not shown) as is well known in the art.

Four precision dial indicators 98 are mounted to the frame of the upper die with feelers extending through the frame to be received on contact pads 100 mounted in the upper frame of the lower die as best seen in FIGS. 8 and 9 or 10.

C. Assembly and Operation of the Die Set

The true four post configuration of the die set incorporating the present invention allows extreme precision in assembly of the upper and lower die structure and the elevation structure to obtain maximum relative registration of the upper and lower die structures and relative planarity through adjustment after assembly, as described subsequently. A single assembly tool is employed for registration and assembly of the top die structure, lower die structure and elevation structure. Since the four post configuration requires accurate registration of the cylindrical caps 93 attached to the upper die structure, bearing blocks 64 attached to the elevation structure and bearing blocks 76 attached to the lower die structure, a single tool having precision placed pins to receive the four components of each set of the referenced elements, with assembly of the associated structure to the elements while constrained on the tool, provides substantially exact relative registration with respect to the rods of the four post system. After assembly of the top die structure, lower die structure and elevation structure, the lower die structure is secured to the support frame of the exposure cabinet, as previously described, and the rods are inserted in bearing blocks 76. The elevation support structure is mounted in the cabinet by attachment of the ball nuts and the rod lower ends are inserted in bearing blocks 64. With the elevation structure in the upward or open position, the upper die structure is then mounted by inserting the upper rod ends in the cylindrical caps.

Operation of the servo motor to position the elevation structure in the upper or open position and the lower or closed position can then be accomplished. As the elevation support structure is lowered to the closed position, precision dial indicators 98 mounted at four locations within the frame of the upper die are monitored for contact of the feelers of the gauges with the lower die. Precise adjustment of the contact point for all four precision dial indicators is accomplished through adjustment of the machine screws 68 in bearing blocks 64 of the elevation support structure. Contact of the rod ends with the hardened surface or insert of the adjustment screws allows precise adjustment of each rod to achieve uniform precision dial indicator readings. Lock nuts 74 are then tightened to secure machine screws 68 in their adjusted positions.

Operation of the servo motor, through the associated transmission and ball screws, then provides repeatable motion for opening and closing the upper die with respect to the lower die. Range of motion on the upper die is adjusted by computer control of the servo motor for open and closed position. The PC controller 18 interfaces with a motor controller for control of the servo motor and interactive program control through the PC by the operator allows setting of servo motor position for die set open (upper die elevated), die set closed, die set close off contact and other desired operational positions of the die set.

The configuration of the bearing blocks in the elevation structure provides for automatic relief on the four post structure upon contact of the upper die with the work piece or lower die since continued downward translation of the elevation structure is accommodated with the machine screws 68 disengaging from contact with the rod lower ends while the rods are allowed to translate within the bearing block. Translation of the rods within the bearing block, however, maintains overall registration of the system. Upward motion of the elevation structure results in contact by the adjustment machine screws with the lower rod ends for upward motion of the upper die. The automatic relief provided by the system accommodates varying tolerance of the work piece and achieves die set contact without requiring extraordinary accuracy of the servo motor control to avoid damage to the die set structure. The automatic relief provided in the system also avoids crushing injury or system damage should an operator or other extraneous materials be present in the exposure zone during operation of the die set.

Figure 15:
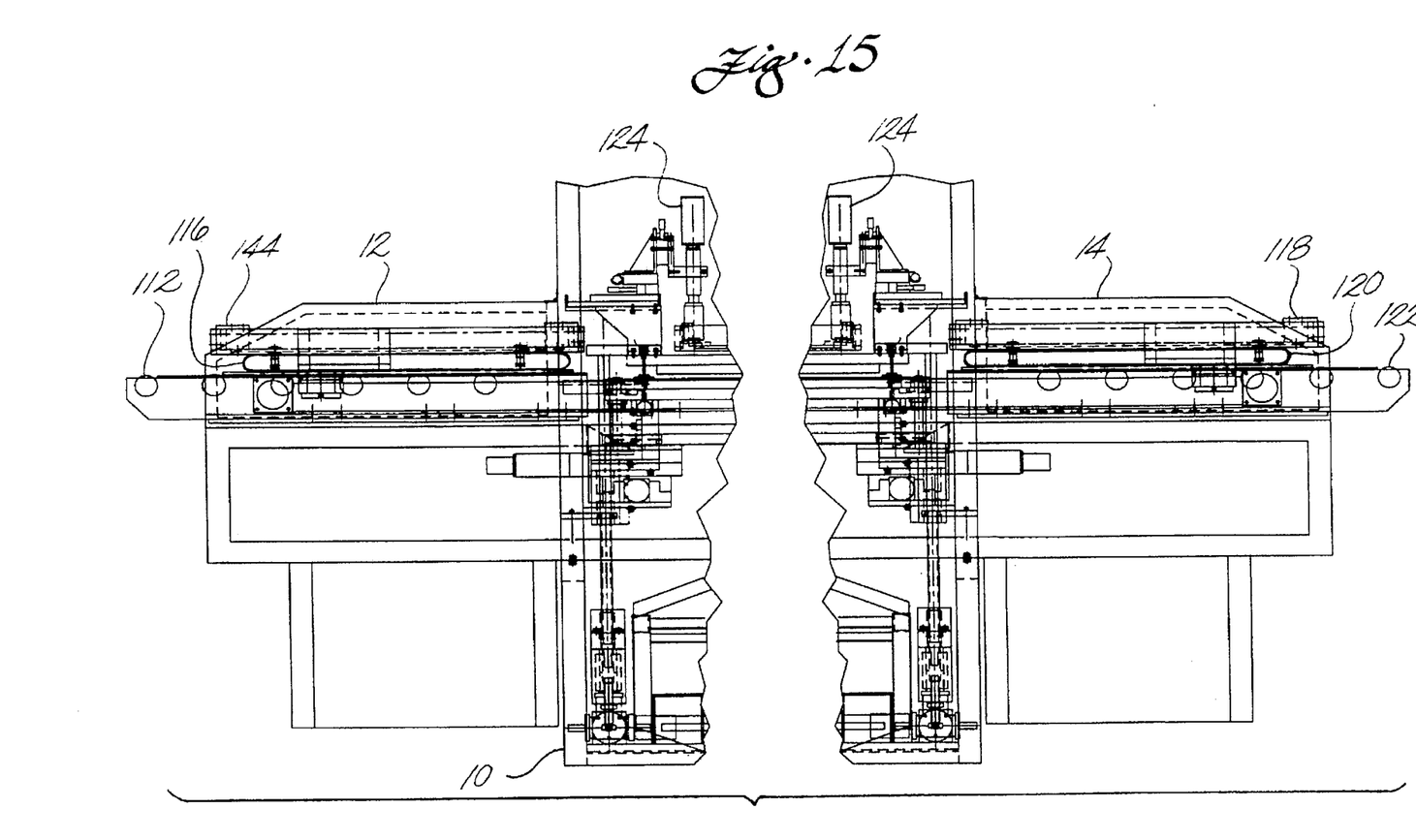
FIG. 15 is a partial sectional front elevation view of the exposure system of FIG. 1 showing the photo tool die set four post structure and work piece handling system including panel transport shuttles, infeed and outfeed rollers and transfer arms.

Referring to FIG. 15, overall operation of the double-sided UV exposure system can be described. A work piece panel is provided on standard equipment conveyers (not shown) to rollers 112 in the infeed section 12 of the exposure unit. Pre-alignment bars (not shown) position the panel received on the rollers for pickup by infeed shuttle 114. The infeed shuttle employs suction cups to pick up the work piece panel, as conventionally known in the art, for transport into the exposure zone of the phototool. High speed transfer arms 116 convey the infeed shuttle to the exposure zone with the die set in an open position. Vacuum on the suction cups of the infeed shuttle is released and the panel is received on the lower die. The infeed shuttle is then retracted on the transfer arms.

The upper die is then lowered by operation of the servo motor and elevation structure, as previously described, closing the die set. If vacuum contact is desired for the exposure, seal 88 on support glass of the lower die is inflated and vacuum drawn on the exposure zone urging the upper and lower die art work support glass into contact with the panel.

Exposure of the work piece is then accomplished using collimated UV light from the lamp modules in the lamp house as is known in the art. Upon completion of exposure, the die set is opened by moving the upper die upwardly and an outfeed shuttle 118 is conveyed into the exposure area by outfeed transfer arms 120 to pick up the panel. The outfeed shuttle is then retracted by the outfeed transfer arm into the outfeed section 14 and the panel is released onto outfeed rollers 122 to be conveyed to standard finished part conveyers (not shown) for further processing.

The true four post configuration of the die set operation system allows the use of standard infeed and outfeed shuttles and transfer arms which are straddled by rods 44. Similarly, with the die set in the closed position or close off contact position, extension of CCD cameras 124 over the die set for art work alignment verification is unimpeded based on the lack of any actuation components above the die set. Additionally, a motorized alignment system for the lower die set to adjust art work alignment is easily accommodated with the four post system since free access to the sides of the lower die is available for attachment of motor drive components or manual adjustment micrometers to the upper and lower frames of the die.

Having now described the invention and its operation in detail as required by the patent statutes, those skilled in the art will recognize minor modifications or substitutions for the embodiments disclosed herein. Such modifications and substitutions are included within the scope of the invention as defined in the following claims:

What is claimed is:

1. A double-sided UV exposure system comprising:

an exposure cabinet having a base and a support frame;

a phototool die set having
an upper die structure having four rod caps mounted in a spaced quadrilateral relation thereon and
a lower die structure rigidly mounted to the support frame and having four bearing blocks mounted thereon in said spaced quadrilateral relation;

an elevation structure having four closed end bearing blocks mounted thereon in said spaced quadrilateral relation;

means for reversibly raising the elevation structure from a first lower position to a second upper position; and four rods removably supported in said closed end bearing blocks, said rods extending through said bearing blocks mounted to the lower die structure and received in said rod caps mounted to the upper die structure whereby raising the elevation structure from said first position to said second position raises the upper die structure from a first closed position to a second open position.

2. A double-sided UV exposure system as defined in claim 1 further comprising:

an infeed section incorporating means for work piece panel insertion into the phototool die set; and an outfeed section incorporating means for said work piece panel removal from the phototool die set.

3. A double-sided UV exposure system as defined in claim 1 wherein the upper die structure comprises a substantially rectangular frame and the rod caps are mounted on flanges attached proximate each corner of the frame, said frame further housing a glass art work support plate.

4. A double-sided UV exposure system as defined in claim 3 wherein the lower die structure comprises a substantially rectangular lower frame mounted to a base structure;

a substantially rectangular upper frame supported by the lower frame and translatable in first and second horizontal directions, the upper frame housing a second glass art work support plate;

four arms each having a first end attached to said base structure and a second end attached to one of said bearing blocks, said arms positioning said bearing blocks in a registration with said rod caps mounted to the upper die structure; and means for rigidly mounting said base structure to said support frame.

5. A double-sided UV exposure system as defined in claim 1 wherein the elevation structure comprises:

two horizontal supports each having two of said closed end bearing blocks mounted one on each end thereof, the horizontal supports having a width defined to place the closed end bearing blocks mounted thereto in a registration with the bearing blocks and end caps, and wherein the means for reversibly raising the elevation structure comprises:

two ball screws received in ball nuts substantially centrally mounted to said horizontal supports, said ball screws each having a first end mounted for rotational movement in a bearing attached to said support frame and a second end mounted to a drive train; and a servo motor connected to the drive train to rotate said ball screws in a first direction elevating said horizontal supports and a second direction depressing said horizontal supports.

6. A double-sided UV exposure system as defined in claim 5 wherein the servo motor and said drive train are mounted to the base of said exposure cabinet.

7. A double-sided UV exposure system as defined in claim 5 further comprising:

a lamp house directing UV light into said exposure cabinet to be received by an upper collimating mirror mounted to the support frame over the upper die and a lower collimating mirror mounted to the base on stand off brackets, said stand off brackets positioning said lower collimating mirror intermediate the rods of the die set and above said servo motor and said drive train thereby minimizing particulate contamination of the lower mirror.

8. A double-sided UV exposure system as defined in claim 1 wherein the closed end bearing blocks include means for vertically adjusting a contact point for the rods received therein.

9. A double-sided UV exposure system as defined in claim 8 wherein the vertical adjusting means comprises a threaded bolt inserted through a threaded bore in a closed end of each of said closed end bearing blocks.

10. A double-sided UV exposure system as defined in claim 1 further comprising:

a lamp house directing UV light into said exposure cabinet to be received by an upper collimating mirror mounted to the support frame over the upper die and a lower collimating mirror mounted to the base intermediate the rods of the die set.

11. A double-sided UV exposure system comprising:

an exposure cabinet having a base and a support frame;

a phototool die set having an upper die structure having a substantially rectangular frame and four rod caps mounted on flanges attached proximate each corner of the rectangular frame, said rectangular frame further housing a glass art work support plate;

a lower die structure having a substantially rectangular lower frame mounted to a base structure, a substantially rectangular upper frame supported by the lower frame and translatable in first and second horizontal directions, the upper frame housing a second glass art work support plate.

four arms each having a first end attached to said base structure and a second end attached to one of four bearing blocks, said arms positioning said bearing blocks in a registration with said rod caps mounted to the upper die structure, and means for rigidly mounting said base structure to said support frame;

an elevation structure having two horizontal supports each having two closed end bearing blocks mounted one on each end thereof, the horizontal supports having a width defined to place the closed end bearing blocks mounted thereto in a registration with the bearing blocks and end caps;

means for reversibly raising the elevation structure including two ball screws received in ball nuts substantially centrally mounted to said horizontal supports, said ball screws each having a first end mounted for rotational movement in a bearing attached to said support frame and a second end mounted to a drive train, and a servo motor connected to the drive train to rotate said ball screws in a first direction elevating said horizontal supports and a second direction depressing said horizontal supports; and four rods removably supported in said closed end bearing blocks, said rods extending through said bearing blocks mounted to the lower die structure and received in said rod caps mounted to the upper die structure whereby raising the elevation structure from a first position to a second position raises the upper die structure from a first closed position to a second open position.

12. A double-sided UV exposure system as defined in claim 11 wherein the closed end bearing blocks include means for vertically adjusting a contact point for the rods received therein comprising a threaded bolt inserted through a threaded bore in a closed end of each of said closed end bearing blocks.

13. A double-sided UV exposure system as defined in claim 11 further comprising:

a lamp house directing UV light into said exposure cabinet to be received by an upper collimating mirror mounted to the support frame over the upper die and a lower collimating mirror mounted to the base on stand off brackets, said stand off brackets positioning said lower collimating mirror intermediate the rods of the die set and above said servo motor and said drive train thereby minimizing particulate contamination of the lower mirror.

14. A double-sided UV exposure system as defined in claim 13 further comprising:

an infeed section incorporating means for work piece panel insertion into the phototool die set; and an outfeed section incorporating means for said work piece panel removal from the phototool die set.

* * * * *